US009012545B2

(12) United States Patent
Gu et al.

(10) Patent No.: US 9,012,545 B2
(45) Date of Patent: *Apr. 21, 2015

(54) COMPOSITION AND METHOD FOR PREPARING PATTERN ON A SUBSTRATE (75) Inventors: Xinyu Gu, Lake Jackson, TX (US); Shih-Wei Chang, Natick, MA (US); Rahul Sharma, Lake Jackson, TX (US); Valeriy Ginzburg, Midland, MI (US); Phillip Hustad, Manvel, TX (US); Jeffrey Weinhold, Lake Jackson, TX (US); Peter Trefonas, Medway, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 224 days.

This patent is subject to a terminal disclaimer.

(21) Appl. No.: 13/601,183

(22) Filed: Aug. 31, 2012

(65) Prior Publication Data

US 2014/0061155 A1 Mar. 6, 2014

(51) Int. Cl.
*C08K 5/01* (2006.01)
*C03C 15/00* (2006.01)
*C08K 5/357* (2006.01)
*C08K 5/04* (2006.01)
*C09D 153/00* (2006.01)
*G03F 7/00* (2006.01)

(52) U.S. Cl.
CPC .............. *C09D 153/00* (2013.01); *G03F 7/00* (2013.01)

(58) Field of Classification Search
CPC ............ B32B 7/14; C09D 153/00; G03F 7/00
USPC ............ 216/55; 524/108, 126, 151, 291, 317, 524/333, 342, 505
See application file for complete search history.

(56) References Cited

U.S. PATENT DOCUMENTS

| | | | |
|---|---|---|---|
| 6,926,953 B2 | 8/2005 | Nealey et al. | |
| 7,763,319 B2 | 7/2010 | Cheng et al. | |
| 8,043,520 B2 | 10/2011 | Asakawa et al. | |
| 8,513,356 B1 * | 8/2013 | Sharma et al. | 525/89 |
| 2006/0134556 A1 | 6/2006 | Nealey et al. | |
| 2008/0299353 A1 | 12/2008 | Stoykovich et al. | |
| 2009/0087664 A1 | 4/2009 | Nealey et al. | |
| 2009/0092803 A1 | 4/2009 | Bita et al. | |
| 2009/0181171 A1 | 7/2009 | Cheng et al. | |
| 2009/0260750 A1 | 10/2009 | Nealey et al. | |
| 2009/0305173 A1 | 12/2009 | Xiao et al. | |
| 2011/0097559 A1 | 4/2011 | Hawker et al. | |
| 2012/0046415 A1 | 2/2012 | Millward et al. | |
| 2014/0014002 A1 * | 1/2014 | Gu et al. | 106/287.1 |

OTHER PUBLICATIONS

Chen, et al., Alignment of Cylindrical Microdomains on a Grating Substrate by Binary Blends of Polystyrene-Poly (methyl methacrylate), Journal of Photopolymer Science and Technology, vol. 20, No. 4, pp. 505-510 (2007).

Zhao, et al., SAXS Analysis of the Order-Disorder Transition and the Interaction Parameter of Polystyrene-block-poly (methyl methacrylate), Macromolecules, vol. 41, pp. 9948-9951 (2008).

Matsen, et al., Unifying Weak- and Strong-Segregation Block Copolymer Theories, Macromolecules, vol. 29, No. 4, pp. 1091-1098 (1996).

Ginzburg, et al., Theoretical Modeling of the Relationship Between Young's Modulus and Formulation Variables for Segmented Polyurethanes, Journal of Polymer Science: Part B: Polymer Physics, vol. 45, pp. 2123-2135 (2007).

Han, et al., Perpendicular Orientation of Domains in Cylinder-Forming Block Copolymer Thick Films by Controlled Interfacial Interactions, Macromolecules, vol. 42, No. 13, pp. 4896-4901 (2009).

Ahn, et al., Fabrication of well-defined block copolymer nano-cylinders by controlling the thermodynamics and kinetics involved in block copolymer self-assembly, Soft Matter, The Royal Society of Chemistry, vol. 4, pp. 1454-1466 (2008).

Kim, et al., Solvent-Induced Ordering in Thin Film Diblock Copolymer/Homopolymer Mixtures, Advanced Materials, vol. 16, No. 23-24, pp. 2119-2123 (2004).

Park, et al., Highly Ordered Nanoporous Thin Films by Blending of PSt-b-PMMA Block Copolymers and PEO Additives as Structure Directing Agents, Journal of Polymer Science: Part A: Polymer Chemistry, vol. 46, issue 24, pp. 8041-8048 (2008).

Ahn, et al., Temperature-Dependent Phase Behaviors in Cylinder-Forming Block Copolymers, International Journal of Molecular Sciences, issue 10, pp. 2169-2189 (2009).

Copending U.S. Appl. No. 13/370,571.

* cited by examiner

*Primary Examiner* — Liam J Heincer
*Assistant Examiner* — Marilou Lacap
(74) *Attorney, Agent, or Firm* — Thomas S. Deibert (57) ABSTRACT A copolymer composition and a method of processing a substrate to form line space features thereon are provided.

8 Claims, 8 Drawing Sheets

COMPOSITION AND METHOD FOR PREPARING PATTERN ON A SUBSTRATE

The present invention relates to the field of self assembling block copolymers. In particular, the present invention is directed to copolymer compositions and methods of preparing patterns on a substrate.

Some block copolymers, consisting of two or more distinct homopolymers joined end to end, are known self-assemble into periodic micro domains having typical dimensions of 10 nanometers to 50 nanometers (nm). The possibility of using such micro domains to pattern surfaces has attracted increasing interest because of the expense and difficulty of patterning in nanoscale dimensions (especially sub-45 nm) using optical lithography.

Controlling the lateral placement of the block copolymer micro domains on the substrates continues to be a challenge, however. This problem has been previously addressed using lithographically pre-defined topographic and/or chemical patterning of the substrate. Previous studies have demonstrated that still-assembled block copolymer micro domains in form of lamellae can be directed to follow chemical patterning of the substrate, yielding periodicities close to those of the chemical pre-patterns. Other studies have shown that by controlling the surface wetting properties of the block copolymer on the bottom and side walls of a topographic pre-pattern, the lamellae can be directed to follow the topographic pre-pattern. The lamellae formed line/space patterns of smaller dimensions than the substrate pre-pattern, subdividing the topographic pre-pattern into a higher frequency line pattern; that is, a line pattern having a smaller pitch. One limitation of block copolymer patterning is the propensity of the patterns to form everywhere on the pre-pattern surface, for topographic and/or chemical guiding pre-patterns.

The ability to shrink the size of various features on a given substrate (e.g., gates in field effect transistors) is currently limited by the wavelength of light used to expose photoresists (i.e., 193 nm). These limitations create a significant challenge for the fabrication of features having a critical dimension (CD) of <50 nm. The use of conventional block copolymers present difficulties in orientation control and long range ordering during the self assembly process. Moreover, such block copolymers frequently provide inadequate etch resistance for subsequent processing steps.

Nealey et al., disclose a blend of two poly(styrene)-b-poly (methyl methacrylate) diblock copolymers in United States Patent Application Publication No. 2006/0134556. Specifically, Nealey et al. disclose the use of a blend of a first ordered poly(styrene)-b-poly(methyl methacrylate) diblock copolymer having a bulk lamellar period of $L_{01}$ and a second ordered poly(styrene)-b-poly(methyl methacrylate) diblock copolymer having a bulk lamellar period $L_{02}$.

Notwithstanding, there remains a need for new copolymer compositions for use in patterning substrates. In particular, there remains a need for new copolymer compositions that enable patterning on intermediate length scales (e.g., 20 to 50 nm) and that preferably exhibit a fast annealing profile with low defect formation.

The present invention provides a copolymer composition, comprising: a poly(styrene)-b-poly(acrylate) block copolymer component; and, an antioxidant; wherein the poly(styrene)-b-poly(acrylate) block copolymer component is a blend, comprising; >50 wt % to 99 wt % (on a solids basis) of an ordered poly(styrene)-b-poly(acrylate) block copolymer, BCP1, having a polystyrene volume fraction. $Vf_{BCP1-PSt}$, of 0.40 to 0.60; and, wherein the following expression is true $$\chi N_{BCP1} > \left[ \frac{1.6}{Vf_{BCP1-PSt} * (1 - Vf_{BCP1-PSt}) - 0.098} \right]$$

wherein $\chi N_{BCP1}$ is the product of the Flory-Huggins interaction parameter, $\chi_{BCP1}$, of BCP1 at 225° C. and the degree of polymerization, $N_{BCP1}$, of BCP1; and, 1 to <50 wt % (on a solids basis) of a disordered poly(styrene)-b-poly(acrylate) diblock copolymer, BCP2, having a polystyrene volume fraction. $Vf_{BCP2-PSt}$, of 0.5 to 0.99; and, wherein the following expression is true $$\chi N_{BCP2} < \left[ \frac{2.6}{Vf_{BCP2-PSt} * (1 - Vf_{BCP2-PSt})} \right]$$

wherein $\chi N_{BCP2}$ is the product of the Flory-Huggins interaction parameter, $\chi_{BCP2}$, of BCP2 at 225° C. and the degree of polymerization, $N_{BCP}2$; wherein the number average molecular weight of BCP1, $M_{N-BCP1}$, is 30 to 500 kg/mol; wherein the number average molecular weight of BCP2. $M_{N-BCP2}$ is 0.1 to <500 kg/mol; and, wherein $M_{N-BCP1} > M_{N-BCP2}$.

The present invention provides a copolymer composition, comprising: a poly(styrene)-b-poly(acrylate) block copolymer component; and, 15 to 25 wt % of an antioxidant (based on the weight of the poly(styrene)-b-poly(acrylate) block copolymer component).

The present invention provides a method of processing a substrate to form line space features on a surface of a substrate, comprising: providing a substrate having a surface; providing a copolymer composition, comprising: a poly(styrene)-b-poly(acrylate) block copolymer component, wherein the number average molecular weight of the poly(styrene)-b-poly(acrylate) block copolymer component is 5 to 1,000 kg/mol; and, an antioxidant; applying a film of the copolymer composition to the surface of the substrate; optionally, baking the film; annealing the film by heating the film at 150 to 350° C. under a gaseous atmosphere for a period of 1 second to 4 hours; and, treating the annealed film to remove the poly (acrylate) block from the annealed film leaving a line space pattern on the surface of the substrate having a pitch, $L_0$, of 10 to 50 nm.

DETAILED DESCRIPTION

The present invention provides copolymer compositions and methods for forming lithographically useful line and space features used in the subsequent pattern transfer processing in the construction of devices requiring microscopic etching or micropatterned surfaces (e.g., microelectronics, microsensors and biochips). The method of the invention provides for the creation of patterns having pitch dimensions divisible by an integer factor relative to a guiding pattern created on a substrate using conventional lithographic means. The ability to form such highly resolved patterns with smaller dimensions, for example, one half or one fourth that which can be produced using conventional lithographic techniques enables, for example, entire new technologies in the design and manufacture of semiconductor chips.

The term "PSt-b-PAcr block copolymer" used herein and in the appended claims is short hand for a poly(styrene)-block-poly(acrylate) diblock copolymer component having a poly(styrene) block and a poly(acrylate) block; wherein the poly(styrene) block includes residues from at least one of styrene, deuterated styrene, as styrene block modifying monomer and deuterated styrene block modifying monomer; and, wherein the poly(acrylate) block includes residues from at least one of an acrylate monomer, a deuterated acrylate monomer, an acrylate block modifying monomer and a deuterated acrylate block modifying monomer.

The term "deuterated styrene" used herein and in the appended claims is a styrene molecule in which at least one hydrogen has been replaced with deuterium.

The term "deuterated styrene block modifying monomer" used herein and in the appended claims is a styrene block modifying monomer in which at least one hydrogen has been replaced with deuterium.

The term "deuterated acrylate monomer" used herein and in the appended claims is an acrylate monomer in which at least one hydrogen has been replaced with deuterium.

The term "deuterated acrylate block modifying monomer" used herein and in the appended claims is an acrylate modifying monomer in which at least one hydrogen has been replaced with deuterium.

The term "$M_N$" used herein and in the appended claims in reference to a block copolymer component of the present invention is the number average molecular weight of the block copolymer component (in g/mol) determined according to the method used herein in the Examples.

The term "$M_{N\text{-}Blend}$ or blend number average molecular weight" used herein and in the appended claims in reference to a PSt-b-PAcr blend used in the copolymer composition of the present invention is the weighted average of the number average molecular weights of the PSt-b-PAcr block copolymers included in the PSt-b-PAcr blend.

The term "$M_W$" used herein and in the appended claims in reference to a block copolymer component of the present invention is the weight average molecular weight of the block copolymer (in g/mol) determined according to the method used herein in the Examples.

The term "$M_{W\text{-}Blend}$ or blend weight average molecular weight" used herein and in the appended claims in reference to a PSt-b-PAcr blend used in the copolymer composition of the present invention is the weighted average of the weight average molecular weights of the PSt-b-PAcr block copolymers included in the PSt-b-PAcr blend.

The term "PD" used herein and in the appended claims, in reference to a block copolymer component of the present invention is the polydispersity of the block copolymer component determined according to the following equation:

$$PD = \frac{M_W}{M_N}.$$

The term "average molecular weight" used herein and in the appended claims in reference to (a) a PSt-b-PAcr block copolymer component that is a single PSt-b-PAcr block copolymer, means the number average molecular weight, $M_N$, for that PSt-b-PAcr block copolymer; and (b) a PSt-b-PAcr block copolymer component that is a blend of two or more different PSt-b-PAcr block copolymers, means the weighted average of the number average molecular weights, $M_N$, of the two or more different PSt-b-PAcr block copolymers in the blend.

The term "$Wf_{PSt}$" used herein and in the appended claims in reference to a PSt-b-PAcr block copolymer component is the weight percent of the poly(styrene) block in the block copolymer component.

The term "$Wf_{PSt\text{-}Blend}$ or blend poly(styrene) weight fraction" used herein and in the appended claims in reference to a PSt-b-PAcr blend used in the copolymer composition of the present invention is the weighted average of the weight percent of the poly(styrene) block in the PSt-b-PAcr block copolymers included in the PSt-b-PAcr blend.

The term "$Wf_{PAcr}$" used herein and in the appended claims in reference to PSt-b-PAcr block copolymer component of the present invention is the weight percent of the poly(acrylate) block in the block copolymer.

The term "$Wf_{PAcr\text{-}Blend}$ or blend poly(acrylate) weight fraction" used herein and in the appended claims in reference to a PSt-b-PAcr blend used in the copolymer composition of the present invention is the weighted average of the weight percent of the poly(acrylate) block in the PSt-b-PAcr block copolymers included in the PSt-b-PAcr blend.

The term "$FW_{St}$" used herein and in the appended claims is the formula weight for styrene 104 g/mol.

The term "$FW_{Acr}$" used herein and in the appended claims is the formula weight for methyl methacrylate, 100 g/mol.

The term "$d_{PSt}$" used herein and in the appended claims is the density of poly(styrene), 1.05 g/cm$^3$.

The term "$d_{PAcr}$" used herein and in the appended claims is the density of poly(methyl methacrylate), 1.18 g/cm$^3$.

The term "$d_{BCP}$" used herein and in the appended claims in reference to a PSt-b-PAcr diblock copolymer of the present invention is the density of the PSt-b-PAcr diblock copolymer according to the following equation:

$$d_{BCP} = \frac{d_{PSt} \times d_{PAcr}}{((d_{PAcr} \times Wf_{PSt}) + (d_{PSt} \times Wf_{PAcr}))}.$$

The term "$Vf_{PSt}$" used herein and in the appended claims in reference to a PSt-b-PAcr diblock copolymer of the present invention is the volume fraction of the poly(styrene) block in the PSt-b-PAcr diblock copolymer according to the following equation:

$$Vf_{PSt} = \left[\frac{(Wf_{PSt} \times d_{BCP})}{d_{PSt}}\right].$$

The term "$Vf_{PAcr}$" used herein and in the appended claims in reference to a PSt-b-PAcr diblock copolymer of the present invention is the volume fraction of the poly(acrylate) block in the PSt-b-PAcr diblock copolymer according to the following equation:

$$Vf_{PAcr} = \left[\frac{(Wf_{PAcr} \times d_{BCP})}{d_{PAcr}}\right].$$

The term "$\chi_{BCP}$" used herein and in the appended claims in reference to a PSt-b-PAcr diblock copolymer of the present invention is the Flory-Huggins interaction parameter for the PSt-b-PAcr diblock copolymer at temperature, T, in Kelvin according to the following equation[1].

[1] Zhao, et al., *SAXS Analysis of the Order-Disorder Transition and the Interaction Parameter of Polystyrene-block-poly(methyl methacrylate)*, MACROMOLECULES, vol. 41, pp. 9948-51 (2008).

$$\chi_{BCP} = \left[0.0282 + \left(\frac{4.46}{T}\right)\right].$$

The term "$N_{BCP}$" used herein and in the appended claims in reference to a PSt-b-PAcr diblock copolymer of the present invention is the degree of polymerization of the PSt-b-PAcr diblock copolymer according to the following equation:

$$N_{BCP} = \left[\frac{(Wf_{BCP-PSt} \times M_{N-BCP})}{PW_{PSt}}\right] + \left[\frac{(1 - Wf_{BCP-PSt}) \times M_{N-BCP}}{FW_{Acr}}\right].$$

The term "$\chi N_{BCP}$" used herein and in the appended claims in reference to a PSt-b-PAcr diblock copolymer of the present invention is the mathematical product of $\chi_{BCP}$ and $N_{BCP}$ according to the following equation;

$$\chi N_{BCP} = \chi_{BCP} \times N_{BCP}.$$

Block copolymers are polymers that are synthesized from two or more different monomers and exhibit two or more polymeric chain segments that are chemically different, but yet, are covalently bound to one another. Diblock copolymers are a special class of block copolymers derived from two different monomers (e.g., A and B) and having a structure comprising a polymeric block of A residues covalently bound to a polymeric block of B residues (e.g., AAAAA-BBBBB; AAAAA-X-BBBBB, wherein X is a linking group such as diphenylethylene).

Preferably, the block copolymer component used in the copolymer composition of the present invention is a PSt-b-PAcr diblock copolymer component comprising domains of poly(styrene) and poly(acrylate); wherein the block copolymer exhibits as film pitch, $L_0$, of 10 to 50 nm (preferably 20 to 50 nm; most preferably 20 to 45 nm) when deposited on a substrate under the conditions set forth herein in the Examples.

The copolymer composition of the present invention, comprises a poly(styrene)-b-poly(acrylate) block copolymer component; and, an antioxidant; wherein the poly(styrene)-b-poly(acrylate) block copolymer component is selected from the group consisting of (a) a single PSt-b-PAcr block copolymer; and, (b) a blend of at least two different PSt-b-PAcr block copolymers.

Preferably, the block copolymer component used in the copolymer composition of the present invention is a PSt-b-PAcr diblock copolymer or diblock copolymer blend comprising domains of poly(styrene) and poly(acrylate); wherein the diblock copolymer component has a poly(acrylate) weight fraction. $Wf_{PAcr}$ or $Wf_{PAcr-Blend}$, of 0.40 to 0.60 (preferably 0.45 to 0.55; most preferably 0.48 to 0.52); and wherein the diblock copolymer component has a number average molecular weight, $M_N$ or $M_{N-Blend}$, of 5 to 1,000 kg/mol (preferably 10 to 200 kg/mol; more preferably 15 to 100 kg/mol; most preferably 20 to 60 kg/mol). Diblock copolymers of the present invention having a $Wf_{PAcr}$ or $Wf_{PAcr-Blend}$ of 0.40 to 0.60 and a number average molecular weight, $M_N$ or $M_{N-Blend}$, of 5 to 1,000 kg/mol tend to exhibit alternating lamellar domains of poly(acrylate) and poly(styrene). Given the teachings provided herein, one of ordinary skill in the art will be able to deposit a copolymer composition of the present invention containing such PSt-b-PAcr diblock copolymers, wherein lamellar domains in the deposited copolymer composition will self assemble to orient themselves with their axes of symmetry parallel to the surface of the substrate, perpendicular to the surface of the substrate or a combination of parallel and perpendicular to the surface of the substrate, through the selection and control of the film deposition conditions, for example: (a) the substrate's surface energy (i.e., by pretreating the surface of the substrate with an interposing material), (b) the thickness of the film of copolymer composition deposited, (c) the bake profile of the deposited copolymer composition bake temperature and bake time) and (d) the anneal profile of the deposited copolymer composition (i.e., anneal temperature and anneal time).

Preferably, the poly(styrene)-b-poly(acrylate) block copolymers have a poly(styrene) block, wherein the poly (styrene) block includes residues from at least one of styrene, deuterated styrene, styrene block modifying monomer and deuterated styrene block modifying monomer. More preferably, wherein the poly(styrene) block includes 0 to 100 wt % (preferably, 0 to 15 wt %; more preferably, 0.001 to 15 wt %) of styrene block modifying monomer derived units and deuterated styrene block modifying monomer derived units combined.

Preferably, the styrene block modifying monomer is selected from the group consisting of hydroxystyrene (e.g., 4-hydroxystyrene; 3-hydroxystyrene; 2-hydroxystyrene; 2-methyl-4-hydroxystyrene; 2-tertbutyl-4-hydroxystyrene; 3-methyl-4-hydroxystyrene; 2-fluoro-4-hydroxystyrene; 2-chloro-4-hydroxystyrene; 3,4-dihydroxystyrene; 3,5-dihydroxystyrene; 3,4,5-trihydroxystyrene; 3,5-dimethyl-4-hydroxystyrene; 3,5-tert-butyl-4-hydroxystyrene); siloxystyrene (e.g., 4-trimethylsiloxystyrene; and 3,5-dimethyl-4-trimethylsiloxystrene); and a 4-acetoxystyrene (e.g., 3,5-dimethyl-4-acetoxystyrene; 3,5-dibromo-4-acetoxystyrene; 3,5-dichloro-4-acetoxystyrene); and, combinations thereof. More preferably the styrene block modifying monomer is selected from the group consisting of 4-hydroxystyrene; 3-hydroxystyrene; 2-hydroxystyrene; 2-methyl-4-hydroxystyrene; 2-tertbutyl-4-hydroxystyrene; 3-methyl-4-hydroxystyrene; 2-fluoro-4-hydroxystrene; 2-chloro-4-hydroxystyrene; 3,4-dihydroxystyrene; 3,5-dihydroxystyrene; 3,4,5-trihydroxystyrene; 3,5-dimethyl-4-hydroxystyrene; 3,5-tert-butyl-4-hydroxystrene; and, combinations thereof. Most preferably, the styrene block modifying monomer is selected from the group consisting of 4-hydroxystyrene; 3-hydroxystyrene; 2-hydroxystyrene; and, combinations thereof.

Preferably, the deuterated styrene block modifying monomer is selected from the group consisting of deuterated hydoxystyrene (e.g., deuterated 4-hydroxystyrene; deuterated 3-hydroxystyrene; deuterated 2-hydroxystyrene; deuterated 2-methyl-4-hydroxystyrene; deuterated 2-tertbutyl-4-hydroxystyrene; deuterated 3-methyl-4-hydroxystyrene; deuterated 2-fluoro-4-hydroxystyrene; deuterated 2-chloro-4-hydroxystyrene; deuterated 3,4-dihydroxystyrene; deuterated 3,5-dihydroxystyrene; deuterated 3,4,5-trihydroxystyrene; deuterated 3,5-methyl-4-hydroxystyrene; deuterated 3,5-tert-butyl-4-hydroxystyrene); deuterated siloxystyrene (e.g., deuterated 4-trimethylsiloxystyrene; and deuterated 3,5-dimethyl-4-trimethylsiloxystyrene); a deuterated 4-acetoxystyrene (e.g., deuterated 3,5-dimethyl-4-acetoxystyrene; deuterated 3,5-dibromo-4-acetoxystyrene; and deuterated 3,5-dichloro-4-acetoxystyrene); and, combinations thereof. More preferably the deuterated styrene block modifying monomer is selected from the group consisting of deuterated 4-hydroxystyrene; deuterated 3-hydroxystyrene; deuterated 2-hydroxystyrene; deuterated 2-methyl-4-hydroxystyrene; deuterated 2-tertbutyl-4-hydroxystyrene: deuterated 3-methyl-4-hydroxystyrene; deuterated 2-fluoro-4-hydroxystyrene; deuterated 2-chloro-4-hydroxystyrene; deuterated 3,4-dihydroxystyrene; deuterated 3,5-dihydroxystyrene; deuterated 3,4,5-trihydroxystyrene; deuterated 3,5-dimethyl-4-hydroxystyrene; deuterated 3,5-tert-butyl-4-hydroxystyrene; and combinations thereof. Most preferably, the deuterated styrene block modifying monomer is selected from the group consisting of deuterated 4-hydroxystyrene; deuterated 3-hydroxystyrene; deuterated 2-hydroxystyrene: and, combinations thereof.

Preferably, the poly(styrene)-b-poly(acrylate) block copolymers have a poly(acrylate) block, wherein the poly (acrylate) block includes residues from at least one of acrylate monomer, a deuterated acrylate monomer acrylate block modifying monomer and deuterated acrylate block modifying monomer. More preferably, wherein the poly(acrylate) block includes >75 wt % (more preferably, >90 wt %; most preferably, >95 wt %) of acrylate monomer derived units.

Preferably, the acrylate monomer is selected from the group consisting of aryl (alkyl)acrylate (e.g., phenyl acrylate, phenyl methacrylate); alkyl (alkyl)acrylate (e.g., methyl acrylate, methyl methacrylate); halogenated aryl (alkyl)acrylate (e.g., chlorophenyl acrylate, chlorophenyl methacrylate); halogenated alkyl(alkyl)acrylate (e.g., fluoropropyl acrylate, fluoropropyl methacrylate) and, combinations thereof. More preferably, the acrylate monomer is selected from the group consisting of $C_{6-14}$ aryl($C_{1-5}$ alkyl)acrylate; $C_{1-5}$ alkyl ($C_{1-5}$ alkyl)acrylate. Still more preferably, the acrylate monomer is selected from the group consisting of butyl(meth)acrylate, propyl(meth)acrylate) ethyl(meth)acrylate, methyl(meth)acrylate. Most preferably, the acrylate monomer is methyl methacrylate.

Preferably, the deuterated acrylate monomer is selected from the group consisting of deuterated aryl(alkyl)acrylate deuterated phenyl acrylate, deuterated phenyl methacrylate); deuterated alkyl(alkyl)acrylate (e.g., deuterated methyl acrylate, deuterated methyl, methacrylate); deuterated halogenated aryl(alkyl)acrylate (e.g., deuterated chlorophenyl acrylate, deuterated chlorophenyl methacrylate); deuterated halogenated alkyl (alkyl)acrylate (e.g., deuterated fluoropropyl acrylate, deuterated fluoropropyl methacrylate) and, combinations thereof. More preferably, the deuterated acrylate monomer is selected from the group consisting of deuterated $C_{6-14}$ aryl ($C_{1-5}$ alkyl)acrylate; deuterated $C_{1-5}$ alkyl ($C_{1-5}$ alkyl)acrylate. Still more preferably, the deuterated acrylate monomer is selected from the group consisting of deuterated butyl(meth)acrylate, deuterated propyl(meth)acrylate), deuterated ethyl(meth)acrylate, deuterated methyl(meth)acrylate. Most preferably, the deuterated acrylate monomer is deuterated methyl methacrylate.

Preferably, the acrylate block modifying monomer is selected from the group consisting of an alkene and a cycloalkene. More preferably, the acrylate block modifying monomer is selected from a $C_{1-5}$ alkene and a $C_{3-7}$ cycloalkene. Most preferably, the acrylate block modifying monomer is ethylene.

Preferably, the deuterated acrylate block monomer is selected from the group consisting of a deuterated alkene and a deuterated cycloalkene. More preferably, the deuterated acrylate block modifying monomer is selected from a deuterated $C_{1-5}$ alkene and deuterated a $C_{3-7}$ cycloalkene. Most preferably, the deuterated acrylate block modifying monomer is deuterated ethylene.

When the poly(styrene)-b-poly(acrylate) block copolymer component comprises a blend of PSt-b-PAcr block copolymers; the PSt-b-PAcr block copolymer component preferably comprises: >50 wt % to 100 wt % (on a solids basis) of ordered PSt-b-PAcr block copolymers, BCP1, having a polystyrene volume fraction, $Vf_{BCP1-PSt}$, of 0.40 to 0.60 (preferably 0.45 to 0.55: more preferably 0.48 to 0.52); and, for which the following expression[2] is true

[2] The expression was derived from self consistent mean field theory corresponding to the range of poly(styrene) volume fractions from 0.65 to 0.87. See, e.g., Matsen, et al., *Unifying Weak-and Strong-Segregation Block Copolymer Theories*, MACROMOLECULES, vol. 29, no. 4, pp. 1091-1098 (1996); Ginzburg, et al., *Theoretical Modeling of the Relationship Between Young's Modulus and Formulation Variables for Segmented Polyurethanes*, JOURNAL OF POLYMER SCIENCE: PART B: POLYMER PHYSICS, vol. 45, pp. 2123-2135 (2007).

$$\chi N_{BCP1} > \left[ \frac{1.6}{Vf_{BCP1-PSt} * (1 - Vf_{BCP1-PSt}) - 0.098} \right]$$

wherein $\chi N_{BCP1}$ is the product of the Flory-Huggins interaction parameter, $\chi_{BCP1}$, of each BCP1 at 225° C. and the degree of polymerization, $N_{BCP1}$, of each BCP1 (preferably wherein $\chi N_{BCP1}$ is 20 to 100, more preferably 20 to 40, most preferably 25 to 35). More preferably, the PSt-b-PAcr block copolymer component comprises: >50 wt % to 99 wt % (on a solids basis) of ordered PSt-b-PAcr block copolymers. BCP1, for which the following expression[3] is true

[3] The expression was derived from self consistent mean field theory corresponding to the range of poly(styrene) volume fractions from 0.65 to 0.87. See, e.g., Matsen, et al., *Unifying Weak-and Strong-Segregation Block Copolymer Theories*, MACROMOLECULES, vol. 29, no. 4, pp. 1091-1098 (1996); Ginzburg, et al. *Theoretical Modeling of the Relationship Between Young's Modulus and Formulation Variables for Segmented Polyurethanes*, JOURNAL OF POLYMER SCIENCE: PART B; POLYMER PHYSICS, vol. 45, pp. 2123-2135 (2007).

$$\chi N_{BCP1} > \left[ \frac{1.6}{Vf_{BCP1-PSt} * (1 - Vf_{BCP1-PSt}) - 0.098} \right]$$

wherein $\chi N_{BCP1}$ is the product of the Flory-Huggins interaction parameter. $\chi_{BCP1}$, of each BCP1 at 225° C. and the degree of polymerization, $N_{BCP1}$, of each BCP1 (preferably wherein $\chi N_{BCP1}$ is 20 to 100, more preferably 20 to 40, most preferably 25 to 35); and, 0.1 to <50 wt % (preferably 10 to 30 wt %; more preferably 15 to 25 wt %) (on a solids basis) of disordered PSt-b-PAcr diblock copolymers, BCP2, for which the following expression[4] is true.

[4] The expression was derived from self consistent mean field theory corresponding to the range of poly(styrene) volume fractions from 0.5 to 0.99. See, e.g., references cited in FOOTNOTE 3.

$$\chi N_{BCP2} < \left[ \frac{2.6}{Vf_{BCP2-PSt} * (1 - Vf_{BCP2-PSt})} \right]$$

wherein $\chi N_{BCP2}$ is the product of the Flory-Huggins interaction parameter, $\chi_{BCP2}$, of each BCP2 at 225° C. and the degree of polymerization, $N_{BCP2}$, of each BCP2 (preferably wherein $\chi N_{BCP1}$ is <15; more preferably >0 to 10; most preferably 5 to 7). Preferably, $M_{N-BCP1} > M_{N-BCP2}$. More preferably, $M_{W-BCP1} > 2 * M_{W-BCP2}$. Preferably, the volume fraction of the poly(styrene) block in the ordered PSt-b-PAcr diblock copolymer, $Vf_{BCP1-PSt}$, and the volume fraction of the poly(styrene) block in the disordered PSt-b-PAcr diblock copolymer, $Vf_{BCP2-PSt}$, used in the diblock copolymer blend are within 20% of one another such that the following equation is satisfied:

$$0.20 \geq \left[ \frac{Vf_{BCP1-PSt} - Vf_{BCP2-PSt}}{Vf_{BCP1-PSt}} \right].$$

More preferably, the poly(styrene) block volume fractions of the ordered PSt-b-PAcr diblock copolymer, $Vf_{BCP1-PSt}$, and of the disordered PSt-b-PAcr diblock copolymer, $Vf_{BCP2-PSt}$, used in the diblock copolymer blend are within 0.001 to 20% (still more preferably 0.01 to 20%; most preferably 0.05 to 0.12%) of one another.

Preferably, the copolymer composition contains >2 wt % antioxidant (based on the weight of the PSt-b-PAcr block copolymer component). More preferably, the copolymer composition contains >2 to 30 wt % antioxidant (based on the weight of the PSt-b-PAcr block copolymer component). Still more preferably, the copolymer composition contains 5 to 30 wt % antioxidant (based on the weight of the PSt-b-PAcr block copolymer component). Still more preferably, the copolymer composition contains 10 to 25 wt % antioxidant (based on the weight of the PSt-b-PAcr block copolymer component). Most preferably, the copolymer composition contains 15 to 25 wt % antioxidant (based on the weight of the PSt-b-PAcr block copolymer component).

Antioxidant contained in the copolymer composition of the present invention can be selected from primary antioxidants and secondary antioxidants. Preferably, the antioxidant is selected from the group consisting of antioxidants containing at least one (preferably at least two; more preferably at least three; most preferably three to four) 2,6-di-tert-butylphenol moiety; antioxidants containing at least one (preferably at least two; more preferably at least three; most preferably three to four) moiety according to the formula antioxidants containing at least one (preferably at least two; most preferably two) moiety according to the formula ; and, antioxidants containing at least one (preferably at least two; most preferably two) moiety according to the formula ; and, mixtures thereof. More preferably, the antioxidant is selected from the group consisting of:

-continued mixtures thereof. Still more preferably, the antioxidant is selected from the group consisting of and mixtures of and one or more other antioxidants. Most preferably, the antioxidant is Preferably, the antioxidant (or mixture of antioxidants) contained in the copolymer composition of the present invention has an average molecular eight of ≥358 g/mol. More preferably, the antioxidant (or mixture of antioxidants) contained in the copolymer composition of the present invention has an average molecular weight of ≥600 g/mol. Most preferably, the antioxidant (or mixture of antioxidants) contained in the copolymer composition of the present invention has an average molecular weight of ≥1,000 g/mol.

Preferably, the antioxidant (or mixture of antioxidants) contained in the copolymer composition of the present invention has an average boiling point temperature measured at 760 mm Hg (101.3 kPa) of >400° C. More preferably, the antioxidant (or mixture of antioxidants) contained in the copolymer composition of the present invention has an average boiling point temperature measured at 760 mm Hg (101.3 kPa) of >500° C. Still more preferably, the antioxidant (or mixture of antioxidants) contained in the copolymer composition of the present invention has an average boiling point temperature measured at 760 mm Hg (101.3 kPa) of >700° C. Yet still more preferably, the antioxidant (or mixture of antioxidants) contained in the copolymer composition of the present invention has an average boiling point temperature measured at 760 mm Hg (101.3 kPa) of >800° C. Most preferably, the antioxidant (or mixture of antioxidants) contained in the copolymer composition of the present invention has an average boiling point temperature measured at 760 mm Hg (101.3 kPa) of >1,000° C.

The copolymer composition of the present invention, optionally further comprises a solvent. Solvents suitable for use in copolymer composition include liquids that are able to disperse the poly(styrene)-b-poly(siloxane) block copolymer component into particles or aggregates having an average hydrodynamic diameter of less than 50 nm as measured by dynamic light scattering. Preferably, the solvent used is selected from propylene glycol monomethyl ether acetate (PGMEA), ethoxyethyl propionate, anisole, ethyl lactate, 2-heptanone, cyclohexanone, amyl acetate, γ-butyrolactone (GBL), n-methylpyrrolidone (NMP) and toluene. More preferably, the solvent used is selected from propylene glycol monomethyl ether acetate (PGMEA) and toluene. Most preferably, the solvent used is toluene.

The copolymer composition of the present invention, optionally further comprises an additive. Additives include additional polymers (including homopolymers and random copolymers); surfactants; photoacid generators; thermal acid generators; quenchers; hardeners; adhesion promoters; dissolution rate modifiers; photocuring agents; photosensitizers; acid amplifiers; plasticizers; orientation control agents; and cross linking agents. Preferred additives for use in the copolymer composition of the present invention include surfactants.

Substrates used include any substrate having a surface that can be coated with the copolymer composition in the method of the present invention. Preferred substrates include layered substrates. Preferred substrates include silicon containing substrates (e.g., glass; silicon dioxide; silicon nitride; silicon oxynitride; silicon containing semiconductor substrates such as silicon wafers, silicon wafer fragments, silicon on insulator substrates, silicon on sapphire substrates, epitaxial layers of silicon on a base semiconductor foundation, silicon-germanium substrates); plastic; metals (e.g., copper, ruthenium, gold, platinum, aluminum, titanium and alloys); titanium nitride; and non-silicon containing semiconductive substrates (e.g., non-silicon containing wafer fragments, non-silicon containing wafers, germanium, gallium arsenide and indium phosphide). Most preferred substrates are silicon containing substrates.

Optionally, in the method of the present invention, the surface of the substrate to be coated with the copolymer composition is pretreated with an interposing material before the copolymer composition is applied. Preferably, the pretreatment material acts like a tying layer interposed between the surface of the substrate and the copolymer composition to enhance the adhesion between the PSt-b-PAcr block copolymer component and the substrate. Preferably, the interposing material forms a layer selected from an imaging layer and an orientation control layer.

Imaging layers suitable for use in the method of the present invention include, for example, any type of material that can be patterned or selectively activated. Such materials include, for example, polymer brushes and a self-assembled monolayers of silane and siloxane compounds.

Orientation control layers suitable for use in the method of the present invention include neutral and non-neutral orientation control layers. That is, the orientation control layer can form an interface between the surface of the substrate and copolymer composition that is preferentially wetted by one of the poly(styrene) block or the poly(acrylate) block—i.e., a non-neutral orientation control layer. A neutral orientation control layer refers to a layer that forms an interface between the surface of the substrate and the copolymer composition that is equally wetted by both the poly(styrene) block and the poly(acrylate).

Preferably, the substrate is pretreated in the method of the present invention before depositing the copolymer composition to facilitate the guided self assembly of the PSt-b-PAcr block copolymer component in the copolymer composition. Specifically, the pretreatment can facilitate one of the two conventional methods used for guided self assembly of block copolymer films, namely graphoepitaxy and chemical epitaxy. In the graphoepitaxy, the surface of the substrate is prepatterned with topographical features on the surface of substrate (e.g., trenches) that operate to direct the self organization of the poly(styrene) and the poly(acrylate) blocks in the poly(styrene)-b-poly(acrylate) block copolymer component of the copolymer composition.

In the chemical epitaxy, the surface of the substrate is treated with a film that exhibits a compositional pattern, wherein the affinity between the various parts of the compositional pattern is different for the poly(styrene) block and the poly(acrylate) block. This chemical affinity difference operates to facilitate the directed self assembly of the poly(styrene)-b-poly(acrylate) block copolymer component of the copolymer composition.

Preferably, in the method of the present invention, the interposing layer is formed on the substrate using a method selected from spin coating, dip coating, roll coating, spray coating and laminating (most preferably spin coating). After application of the interposing layer forming material onto the surface of the substrate, the material is optionally further processed to remove any residual solvent. Preferably, the interposing layer is baked at an elevated temperature (e.g., 70 to 340° C.) for at least 10 seconds to minutes to remove any residual solvent from the interposing layer. Preferably, the baked interposing layer is rinsed with a solvent capable of removing any residual unbound interposing layer material from the surface of the substrate and then rebaked at an elevated temperature (e.g., 70 to 340° C.) for at least 10 seconds to 5 minutes to remove any residual solvent.

Applying a film of the copolymer composition comprising the poly(styrene)-b-poly(acrylate) block copolymer component and an antioxidant to the surface of the substrate in the method of the present invention preferably comprises depositing the copolymer composition onto the surface of the substrate using a method selected from spin coating, dip coating, roll coating, spray coating and laminating (most preferably spin coating). After application of as film of the copolymer composition to the substrate, the film is optionally further processed to remove any residual solvent. Preferably, the film is baked at an elevated temperature (e.g., 70 to 340° C.) for at least 10 seconds to 5 minutes to remove any residual solvent from the deposited copolymer composition.

In the method of the present invention, the deposited film of the copolymer composition is then thermally annealed by heating the film at a temperature of $\geq 150°$ C. (preferably 175 to 350° C.; more preferably 200 to 350° C.; still more preferably 225 to 350° C.; most preferably 250 to 300° C.) under a gaseous atmosphere under a gaseous atmosphere for a period of 1 second to 4 hours (preferably 2 seconds to 1 hour; more preferably 30 seconds to 1 hour; most preferably 90 seconds to 1 hour) to enable the poly(styrene)-b-poly(acrylate) block copolymer component to self assemble on the surface of the substrate. Preferably, the deposited film is annealed under a gaseous atmosphere selected from air, nitrogen and argon. Preferably, the deposited film is annealed under a gaseous atmosphere containing $\geq 20$ wt % $O_2$ (preferably, wherein the gaseous atmosphere is air) for a period of 1 second to 4 hours (preferably 2 seconds to 1 hour; more preferably 30 seconds to 1 hour; most preferably 90 seconds to 1 hour).

In the method of the present invention, the annealed film is treated to remove the poly(acrylate) block in the annealed film providing a product film with a plurality of trenches perpendicular to the surface of the substrate. The treatment comprises: exposing the film to conditions that exhibit differential reactivity towards the poly(acrylate) block in the film relative to the poly(styrene) block in the film, to facilitate removal, of the poly(acrylate) domains from the annealed film using well known techniques. Preferably, the treatment comprises: exposing the annealed film to a reactive plasma or a reactive ion etching atmosphere to remove the poly(acrylate) domains; or, by a chemical dissolution process. A preferred reactive plasma treatment for removing the poly(acrylate) domains comprises: exposing the annealed film to a plasma composed of a low pressure ionized oxidizing gas (preferably $O_2$ or $CF_4$); wherein the poly(acrylate) domains in the annealed film are removed. A preferred chemical dissolution process for removing the poly(acrylate) domains comprises: exposing the annealed film to UV radiation to decompose the poly(acrylate) domains in the annealed film (e.g., with 1 $J/cm^2$ 254 nm light); providing a UV exposed film; and, treating the UV exposed film to remove the decomposed poly(acrylate) domains (e.g., ultrasonicating the film in glacial acetic acid, followed by ultrasonicating in deionized water, and then rinsing the film in deionized water) providing a product film.

Some embodiments of the present invention will now be described in detail in the following Examples.

The following materials were passed through a column packed with activated A-2 grade alumina before being used in the Examples herein, namely tetrahydrofuran (99.9% pure available from Aldrich), styrene (available from Aldrich), and cyclohexane (HPCL grade available from Fischer). All the other materials used in the Examples herein were commercial materials that were used as received.

Pentaerythritol tetrakis(3-(3,5-di-tert-butyl-4-hydroxyphenyl)propionate) used in the Examples was obtained from BASF under the trademark IRGANOX® 1010 is referred to in the Examples as "AO-1".

1,3,5-trimethyl-2,4,6-tris(3,5-di-tert-butyl-4-hydroxybenzyl)benzene used in the Examples was obtained from BASF under the trademark IRGANOX® 1330 is referred to in the Examples as "AO-2".

The film thicknesses reported in the Examples herein were measured using a NanoSpec/AFT 2100 Film Thickness Measurement tool. The thickness of the films were determined from the interference of a white light passed through a diffraction grating. A standard program called "Polyimide on Silicon" was used to analyze the component wavelengths (380-780 nm) to determine the film thickness. The thickness of the film of the deposited block copolymer composition and the brush layer were measured together as one polymeric layer. The reported film thickness is the combined thickness of the deposited block copolymer composition and the brush layer.

The number average molecular weight, $M_N$, and polydispersity values reported in the Examples were measured by gel permeation chromatography (GPC) on an Agilent 1100 series LC system equipped with an Agilent 1100 series refractive index and MiniDAWN light scattering detector (Wyatt Technology Co.). Samples were dissolved in HPCL grade THF at a concentration of approximately 1 mg/mL and filtered through at 0.20 μm syringe filter before injection through the two PLGel 300×7.5 mm Mixed C columns (5 mm, Polymer Laboratories, Inc.). A flow rate of 1 mL/min and temperature of 35° C. were maintained. The columns were calibrated with narrow molecular weight PS standards (EasiCal PS-2, Polymer Laboratories, Inc.).

Proton nuclear magnetic resonance ($^1$H NMR) spectroscopy results referred to in the Examples was done on a Varian INOVA 400 MHz NMR spectrometer. Deuterated chloroform was used. A delay time of 10 seconds was used to ensure complete relaxation of protons for quantitative integrations. Chemical shifts are reported relative to tetramethylsilane.

The annealed films deposited in the Examples were examined using a D5000 Atomic Force Microscope. The samples were mounted on the stage using double side tape. A 2 μm by 2 μm phase image was collected for each sample at a scan rate of 1 Hz (256×256 pixels). The images were analyzed with Scanned Probe Image Processor (SPIP v 6.0.4, Image Metrology, Denmark). The film pitch, $L_O$, reported in the Examples was determined using Fourier analysis (2D isotropic power spectral density) where the most intense peak in the spectrum representing the dominant spatial wavelength provides the pitch of the material.

Example 1

Preparation of poly(styrene)-r-poly(methyl methacrylate) Brush

Into a 50 mL Schleak flask was added 2,2,6,6-tetramethyl-1-(1-phenylethoxy) piperidine (0.0625 g), styrene (15 g), methyl methacrylate (8.61 g), hydoxyethylmethacrylate (HEMA)(0.30 g) and a magnetic stir bar. The flask contents were then deoxygenated with a nitrogen gas purge for one (1) hour. The flask was then placed in an oil bath set at 120° C. for 40 hours. After the reaction, the flask was rapidly cooled by placing the flask in an ice bath and adding 70 mL of methylene chloride to the flask contents. The flask contents were then poured into 1 L methanol and the polymer solids were filtered out. The polymer solids were dissolved in 60 mL of methylene chloride and then reprecipitated into another 1 L methanol. The precipitated solids were filtered out and collected via suction filtration and dried in a vacuum oven at 50° C. overnight. The product copolymer brush exhibited a number average molecular weight, $M_N$, of 52.0 kg/mol and a composition of 61.2 mol % polystyrene, 73.4 mol % polymethyl methacrylate and 1.4 mol % HEMA determined by $^{13}$C NMR.

Example 2

Preparation PSt-b-PAcr diblock copolymer ("PSt-b-PAcr-1")

Into a 1 L 3-neck round bottom reactor under an argon atmosphere was added tetrahydrofuran ("THF")(321 g). The THF was then cooled in the reactor to −78° C. The contents of the reactor were then titrated with a 0.36 M solution of sec-butyllithium in cyclohexane until the contents of the reactor exhibited a persistent pale yellow color. The contents of the reactor were then warmed to, and maintained at, 30° C. until the color of the contents completely disappeared (approximately 10-15 minutes). Styrene (12.52 g) was then transferred to the reactor via cannula. The contents of the reactor were then cooled to −78° C. 0.40 g of a Sec-butyllithium solution in cyclohexane (0.56 M) was then rapidly added to the reactor via cannula, causing the reactor contents to turn dark yellow. The resulting exotherm caused the reactor contents to exhibit a 10-15° C. temperature rise within 1 minute of the addition of the sec-butyllithium solution to the reactor. The reactor contents then cooled back down to −78° C. over the following 10 minutes. The reactor contents were allowed to stir for an additional 10 minutes. A small portion of the reactor contents was then withdrawn from the reactor for gel permeation chromatography analysis of the polystyrene block formed, Diphenylethylene (0.069 g) diluted in cyclohexane (5.3 g) was then transferred to the reactor via cannula, causing the reactor contents to turn from a dark yellow to a dark ruby red. The contents of the reactor were then stirred for 10 minutes at −78° C. Then methyl methacrylate (MMA) (13.41 g) diluted in cyclohexane (9.43 g) was then transferred into the reactor via cannula. The resulting exotherm caused the reactor contents to warm to −63° C. within 4 minutes of the MMA addition before cooling back down to −76° C. The reactor contents were stirred for an additional 120 minutes, after which the reaction was quenched by the addition of anhydrous methanol. The reactor contents were then precipitated into 1 L of methanol and the solids were collected by vacuum filtration. The resulting filter cake was then dissolved in 150 mL of dichloromethane and washed twice with 100 mL of deionized water. The solution was then transferred into 1 L of methanol and the precipitated solids were collected by vacuum filtration and dried in a vacuum overt at 60° C. overnight to provide the product block copolymer. The product block copolymer, PSt-b-PAcr-1, exhibited a number average molecular weight, $M_N$, of 88.1 kg/mol; a weight average molecular weight, $M_W$, of 89.0 kg/mol; as polydispersity, PD, of 1.10, a weight fraction of polystyrene. $Wf_{PSt}$, of 50.1 wt %; and a χN value calculated to be 26.4.

Example 3

Preparation PSt-b-PAcr diblock copolymer ("PSt-b-PAcr-2")

Into a 1 L 3-neck round bottom reactor under an argon atmosphere was added tetrahydrofuran ("THF")(327 g). The THF was then cooled in the reactor to −78° C. The contents of the reactor were then titrated with a 0.36 M solution of sec-butyllithium in cyclohexane until the contents of the reactor exhibited a persistent pale yellow color. The contents of the reactor were then warmed to, and maintained at, 30° C. until the color of the contents completely disappeared (approximately 10-15 minutes), Styrene (12.91 g) was then transferred to the reactor via cannula. The contents of the reactor were then cooled to −78° C. 0.81 g of a Sec-butyllithium solution in cyclohexane (0.56 M) was then rapidly added to the reactor via cannula, causing the reactor contents to turn dark yellow. The resulting exotherm caused the reactor contents to exhibit a 10-15° C. temperature rise within 1 minute of the addition of the sec-butyllithium solution to the reactor. The reactor contents then cooled back down to −78° C. over the following 10 minutes. The reactor contents were allowed to stir for an additional 10 minutes. A small portion of the reactor contents was then withdrawn from the reactor for gel permeation chromatography analysis of the polystyrene block formed. Diphenylethylene (0.13 g) diluted in cyclohexane (4.3 g) was then transferred to the reactor via cannula, causing the reactor contents to turn from a dark yellow to a dark ruby red. The contents of the reactor were then stirred for 10 minutes at −78° C. Then methyl methacrylate (MMA) (13.57 g) diluted in cyclohexane (8.47 g) was then transferred into the reactor via cannula. The resulting exotherm caused the reactor contents to warm to −63° C. within 4 minutes of the MMA addition before cooling back down to −76° C. The reactor contents were stirred for an additional 120 minutes, after which the reaction was quenched by the addition of anhydrous methanol. The reactor contents were then precipitated into 1 L of methanol and the solids were collected by vacuum filtration. The resulting filter cake was then dissolved in 150 mL of dichloromethane and washed twice with 100 mL of deionized water. The solution was then transferred into 1 L of methanol and the precipitated solids were collected by vacuum filtration and dried in a vacuum oven at 60° C. overnight to provide the product block copolymer. The product block copolymer, PSt-b-PAcr-2, exhibited a number average molecular weight, $M_N$, of 43.1 kg/mol: a weight average molecular weight, $M_W$, of 43.4 kg/mol; a polydispersity, PD, of 1.10, a weight fraction of polystyrene, $Wf_{PSt}$, of 50.4 wt %; and a χN value calculated to be 12.9.

Example 4

Substrate Preparation

Substrates were prepared by cutting pieces (~1"×1") from a silicon wafer having a native oxide layer. A brush prepared according to Example 1 was dissolved in propylene glycol methyl ether acetate (Dowanol® PMA available from The Dow Chemical Company) to form 0.8 wt % brush solution. The brush solution was then spin coated onto each substrate at 1,500 rpm for 1 minute. The deposited brush layer was then baked by placing the substrate onto a hotplate set at 150° C. for 1 minute. The deposited brush layer was then annealed by placing the substrate onto another hotplate set at 250° C. for 20 minutes in a nitrogen atmosphere. The substrate was then cooled to room temperature. The substrate was then immersed in propylene glycol methyl ether acetate for 1 minute. The substrate was then spun dry at 3,000 rpm for 1 minute. The substrate was then placed on a hotplate set at 150° C. for 1 minute and then stored in nitrogen until used.

Comparative Examples C1-C6 and Examples 5-37

Films

In each of Comparative Examples C1-C4 and Examples 5-37, PSt-b-PAcr-1 block copolymer prepared according to Example 2 was dissolved in propylene glycol methyl ether acetate ("PGMEA")(Dowanol® PMA available from The Dow Chemical Company) to form a base 1.75 wt % solution. In each of Comparative Examples C1-C6, the base solution was used as the spinning solution. In each of Examples 5-37, the antioxidant noted in TABLE 1 was added to the base solution in the wt % (relative to the PSt-b-PAcr-1 block copolymer) noted in TABLE 1 to provide the spinning solution used therein. The spinning solutions were each hand filtered through a 0.2 μm Whatman syringe filter before use. The filtered solutions were then spin coated onto the brushed surface of substrates prepared according to Example 4 at 1,500 rpm to form films. The substrates were then placed on a hotplate set at 150° C. for 1 minute to bake the films. The substrates were then placed on another hotplate set at the annealing temperature noted in TABLE 1 under air for the period of time noted in TABLE 1. Each of the films were then examined by atomic force microscope. A top down image of the fingerprint pattern formed in each of Comparative Examples C1-C6 and Examples 5-37 is provided in FIGS. 1-39, respectively. The pitch, $L_0$, for each of the films is reported in TABLE 1.

TABLE 1

| Ex. | AO (wt %) | AO Type | Anneal Time (minutes) | Anneal Temp. (° C.) | $L_0$ (nm) |
|---|---|---|---|---|---|
| C1 | — | — | 2 | 250 | 42 |
| C2 | — | — | 5 | 250 | 43 |
| C3 | — | — | 10 | 250 | 46 |
| C4 | — | — | 2 | 270 | 43 |
| C5 | — | — | 10 | 270 | 49 |
| C6 | — | — | 30 | 270 | — |
| 5 | 1 | AO-1 | 2 | 250 | 41 |
| 6 | 1 | AO-1 | 10 | 250 | 43 |
| 7 | 1 | AO-1 | 30 | 250 | 43 |
| 8 | 5 | AO-1 | 2 | 250 | 41 |
| 9 | 5 | AO-1 | 10 | 250 | 42 |
| 10 | 5 | AO-1 | 30 | 250 | 43 |
| 11 | 10 | AO-1 | 2 | 250 | 41 |
| 12 | 10 | AO-1 | 10 | 250 | 41 |
| 13 | 10 | AO-1 | 30 | 250 | 42 |
| 14 | 20 | AO-1 | 2 | 250 | 39 |
| 15 | 20 | AO-1 | 5 | 250 | 41 |
| 16 | 20 | AO-1 | 10 | 250 | 44 |
| 17 | 1 | AO-2 | 2 | 250 | 42 |
| 18 | 1 | AO-2 | 10 | 250 | 44 |
| 19 | 1 | AO-2 | 30 | 250 | 49 |
| 20 | 5 | AO-2 | 2 | 250 | 41 |
| 21 | 5 | AO-2 | 10 | 250 | 43 |
| 22 | 5 | AO-2 | 30 | 250 | — |
| 23 | 10 | AO-2 | 2 | 250 | 41 |
| 24 | 10 | AO-2 | 10 | 250 | 43 |
| 25 | 10 | AO-2 | 30 | 250 | — |
| 26 | 20 | AO-2 | 2 | 250 | 41 |
| 27 | 20 | AO-2 | 10 | 250 | 43 |
| 28 | 20 | AO-2 | 30 | 250 | — |
| 29 | 1 | AO-1 | 2 | 270 | 42 |
| 30 | 1 | AO-1 | 10 | 270 | 44 |
| 31 | 1 | AO-1 | 30 | 270 | 50 |
| 32 | 5 | AO-1 | 2 | 270 | 41 |
| 33 | 5 | AO-1 | 10 | 270 | 41 |
| 34 | 5 | AO-1 | 30 | 270 | 43 |
| 35 | 10 | AO-1 | 2 | 270 | 41 |
| 36 | 10 | AO-1 | 10 | 270 | 41 |
| 37 | 10 | AO-1 | 30 | 270 | 41 |

Comparative Example C7 and Example 38

Films

Figure 1:
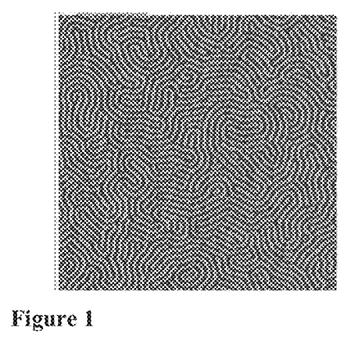
FIGS. 1-39 are depictions of a top down scanning electron microscopic ("SEM") image of the films prepared according to Comparative Example C1-C6 and Examples 5-37, respectively.
Figure 2:
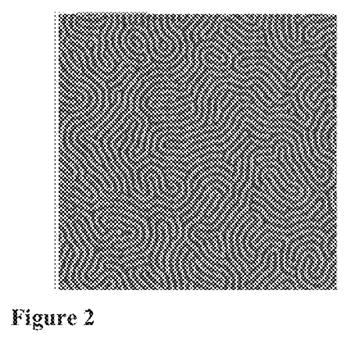
Figure 3:
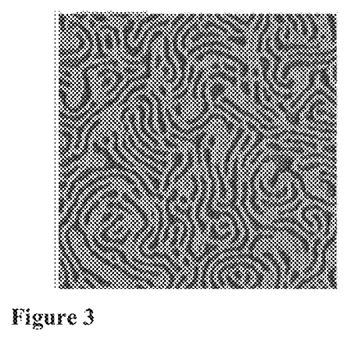
Figure 4:
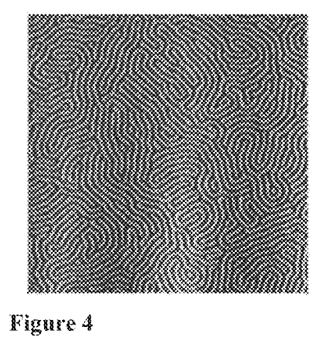
Figure 5:
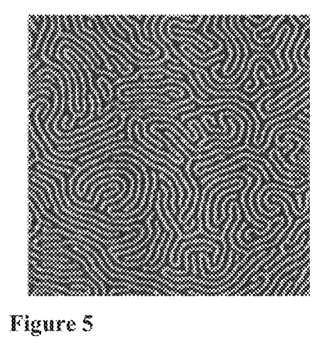
Figure 6:
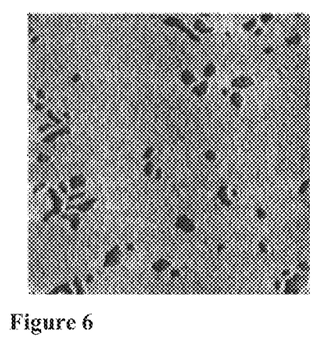
Figure 7:
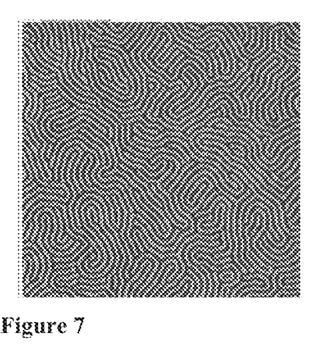
Figure 8:
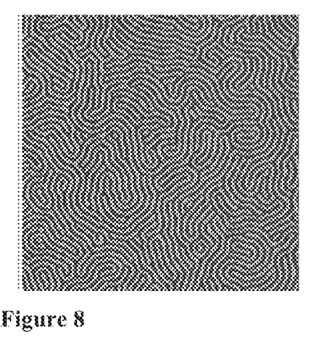
Figure 9:
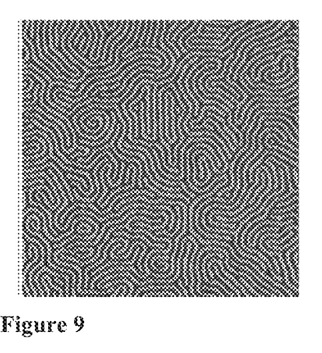
Figure 10:
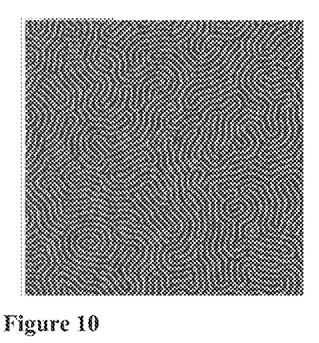
Figure 11:
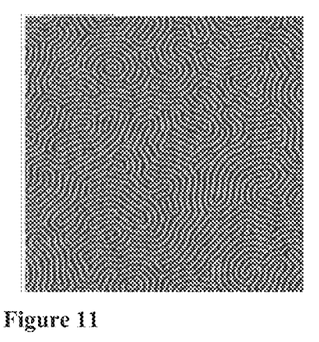
Figure 12:
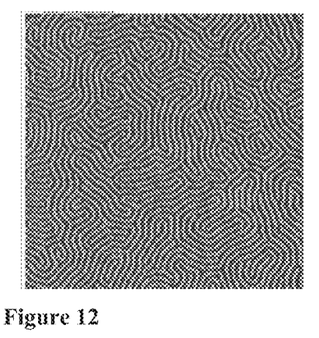
Figure 13:
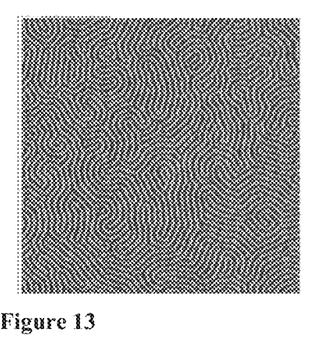
Figure 14:
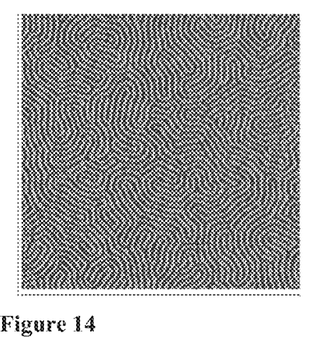
Figure 15:
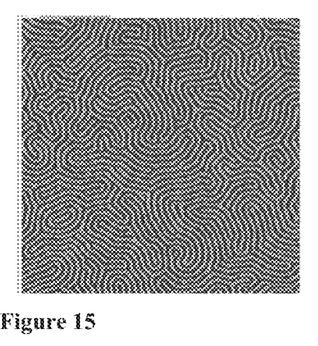
Figure 16:
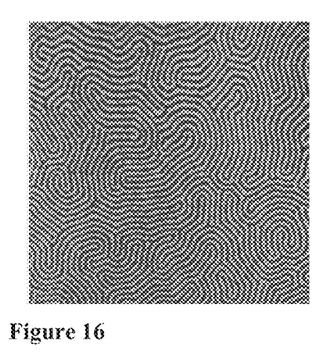
Figure 17:
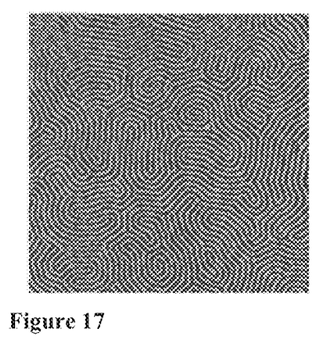
Figure 18:
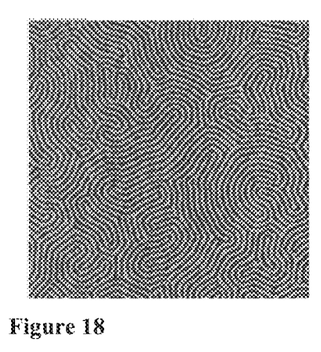
Figure 19:
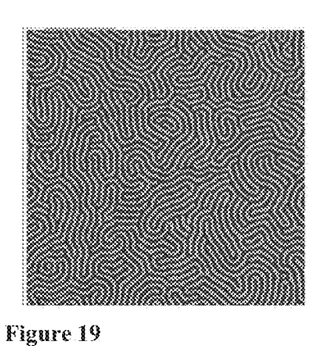
Figure 20:
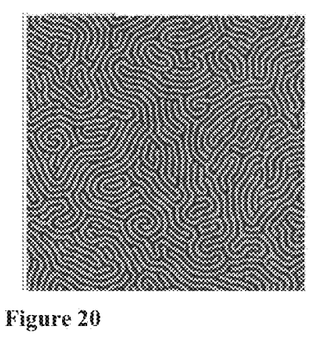
Figure 21:
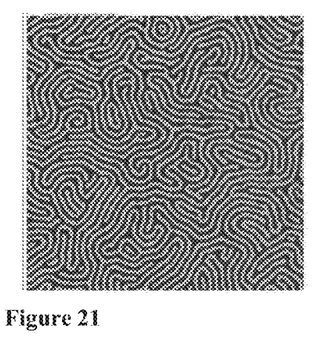
Figure 22:
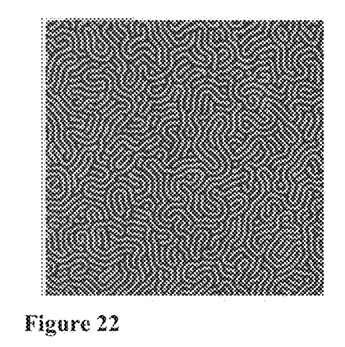
Figure 23:
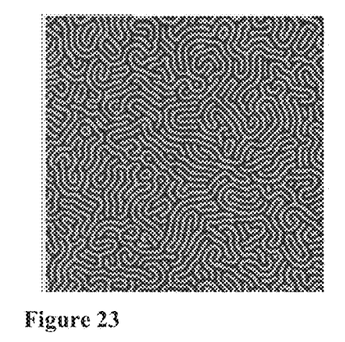
Figure 24:
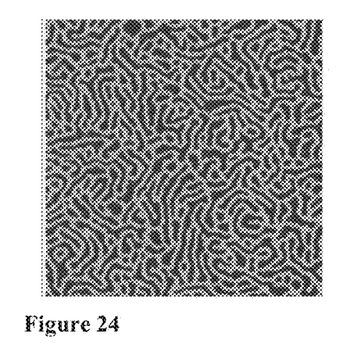
Figure 25:
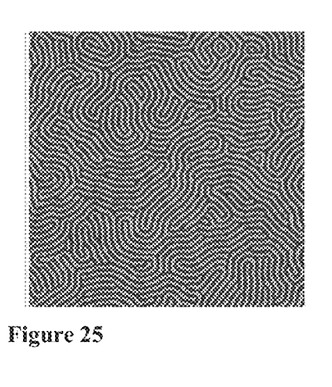
Figure 26:
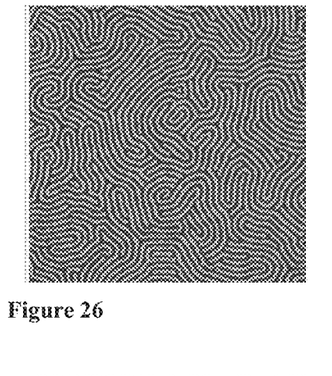
Figure 27:
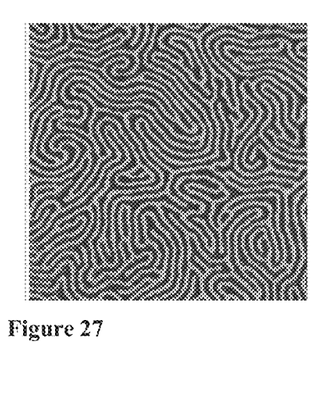
Figure 28:
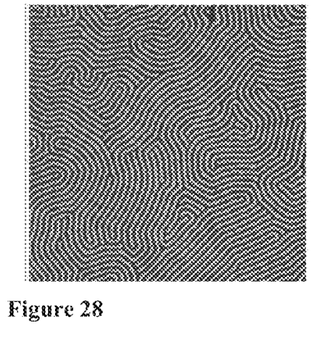
Figure 29:
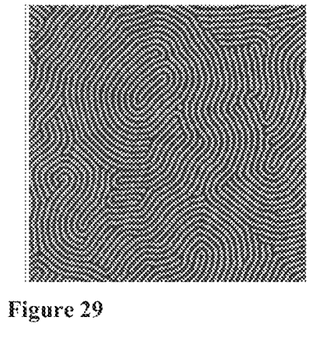
Figure 30:
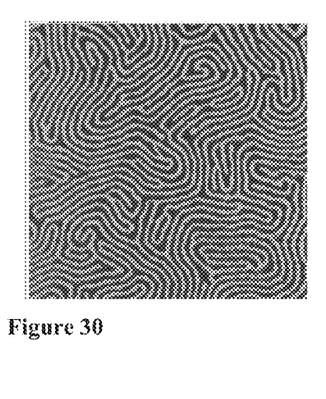
Figure 31:
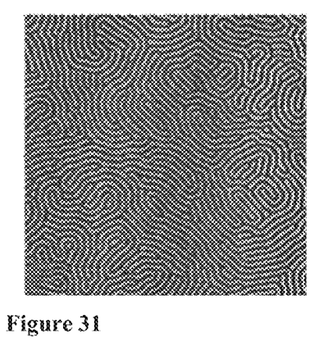
Figure 32:
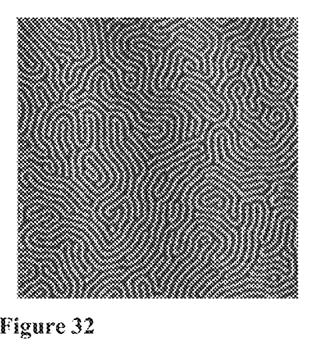
Figure 33:
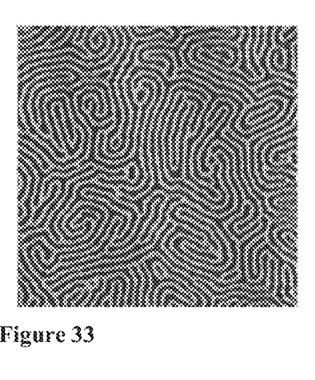
Figure 34:
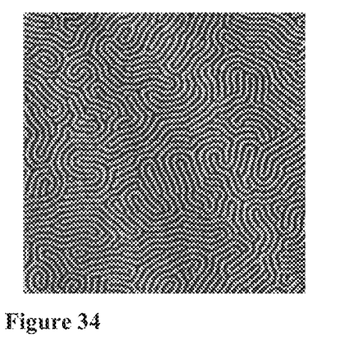
Figure 35:
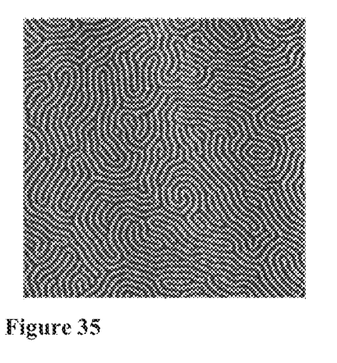
Figure 36:
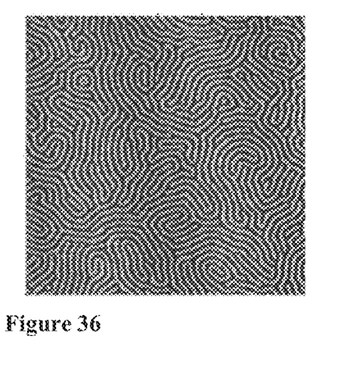
Figure 37:
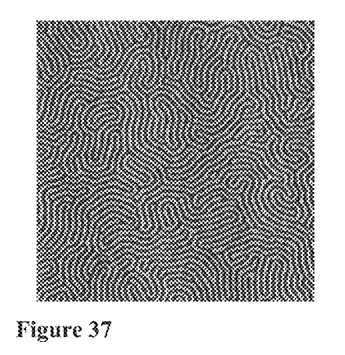
Figure 38:
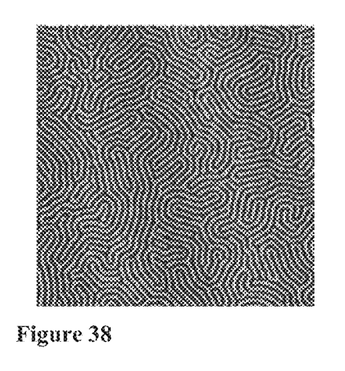
Figure 39:
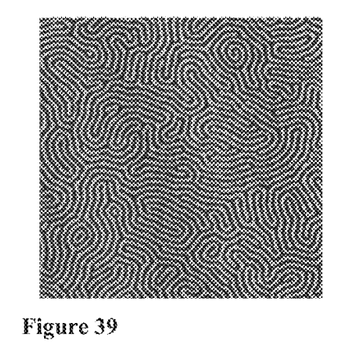
Figure 40:
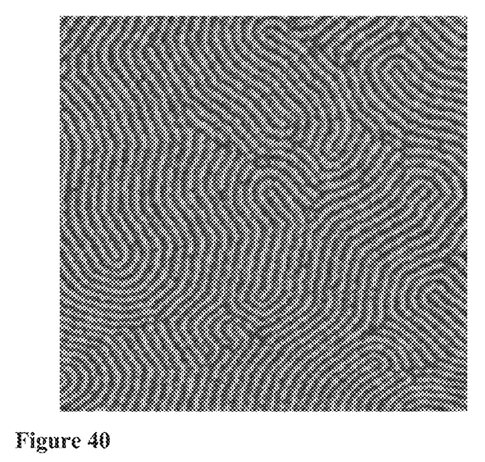
FIGS. 40-41 are depictions of a top down scanning electron microscopic ("SEM") image of the films prepared according to Comparative Example C7 and Example 38, respectively.
Figure 41:
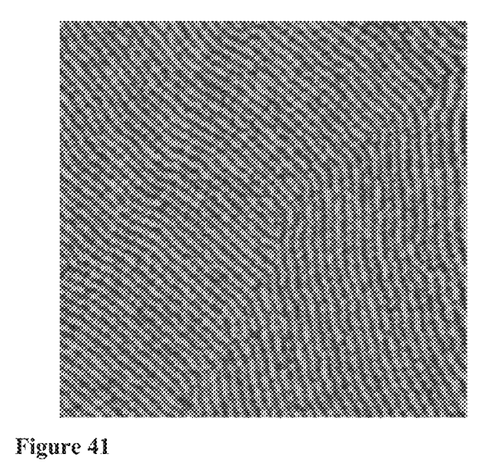

In each of Comparative Example C7 and Example 38, PSt-b-PAcr-2 block copolymer prepared according to Example 3 was dissolved in propylene glycol methyl ether acetate ("PGMEA")(Dowanol® PMA available from The Dow Chemical Company) to form a base 1.5 wt % solution. In Comparative Example C7, the base solution was used as the spinning solution. In Example 38, pentaerythritol tetrakis (3-(3,5-di-tert-butyl-4-hydroxyphenyl)propionate) ("AO-1") was then added to give a spinning solution containing 10 wt % AO-1 relative to the PSt-b-PAcr-2 block copolymer. The spinning solutions were each hand filtered through a 0.2 μm Whatman syringe filter before use. The filtered solutions were then spin coated onto the brushed surface of substrates prepared according to Example 4 at 1,500 rpm to form films. The substrates were then placed on a hotplate set at 150° C. for 1 minute to bake the films. The substrates were then placed on another hotplate set at 250° C. under a nitrogen atmosphere (<10 ppm $O_2$) for an hour. Each of the films were then examined by atomic force microscope. A top down image of the fingerprint pattern formed in each of Comparative Example C7 and Example 38 is provided in FIGS. 40-41, respectively. The film obtained in Comparative Example C7 displayed a fingerprint pattern having a pitch, $L_0$, of 26 nm. The film obtained in Example 38 displayed a fingerprint pattern having a pitch, $L_0$, of 25 nm and exhibited straighter lines than those of Comparative Example C7, indicative of a pattern of much higher quality.

We claim:

1. A copolymer composition, comprising:
a poly(styrene)-b-poly(acrylate) block copolymer, component; and,
an antioxidant;
wherein the poly(styrene)-b-poly(acrylate) block copolymer component is a blend, comprising:
>50 wt % to 99 wt % (on a solids basis) of an ordered poly(styrene)-b-poly(acrylate) block copolymer, BCP1, having a polystyrene volume fraction, $Vf_{BCP1\text{-}PSt}$, of 0.40 to 0.60; and, wherein the following expression is true $$\chi N_{BCP1} > \left[ \frac{1.6}{Vf_{BCP1-PSt}*(1-Vf_{BCP1-PSt})-0.098} \right]$$

wherein $\chi N_{BCP1}$ is the product the Flory-Huggins interaction parameter, $\chi_{BCP1}$, of BCP1 at 225° C. and the degree of polymerization, $N_{BCP1}$, of BCP1; and,
1 to <50 wt % (on a solids basis) of a disordered poly (styrene)-b-poly acrylate) diblock copolymer, BCP2, having a polystyrene volume fraction, $Vf_{BCP2\text{-}PSt}$, of 0.5 to 0.99; and, wherein the following expression is true $$\chi N_{BCP2} < \left[ \frac{2.6}{Vf_{BCP2-PSt}*(1-Vf_{BCP2-PSt})} \right]$$

wherein $\chi N_{BCP2}$ is the product of the Flory-Huggins interaction parameter, $\chi_{BCP2}$ of BCP2 at 225° C. and the degree of polymerization, $N_{BCP2}$, of BCP2;
wherein the number average molecular weight of BCP1, $M_{N\text{-}BCP1}$, is 30 to 500 kg/mol;
wherein the number average molecular weight of BCP2, $M_{N\text{-}BCP2}$ is 0.1 to <500 kg/mol; and,
wherein $M_{N\text{-}BCP1} > M_{N\text{-}BCP2}$.

2. The copolymer composition of claim 1, wherein the copolymer composition is 15 to 25 wt % antioxidant (based on the weight of the copolymer component).

3. The copolymer composition of claim 1, wherein the antioxidant is selected from the group consisting of:
an antioxidant containing at least one 2,6-di-tert-butylphenol moiety;
an antioxidant containing at least one moiety according to the formula an antioxidant containing at least one moiety according to the formula an antioxidants containing at least one moiety according to the formula mixtures thereof.

4. The copolymer composition of claim 1, wherein the antioxidant component is an antioxidant selected from the group consisting of mixtures thereof.

5. The copolymer composition of claim 1, further comprising a solvent; wherein the solvent is selected from the group consisting of propylene glycol monomethyl ether acetate (PGMEA), ethoxyethyl propionate, anisole, ethyl lactate, 2-heptanone, cyclohexanone, amyl acetate, γ-butyrolactone (GBL), n-methylpyrrolidone (NMP) and toluene.

6. The copolymer composition of claim 1, further comprising an additive; wherein the additive is selected from the group consisting of homopolymers; random copolymers; surfactants; photoacid generators; thermal acid generators, quenchers; hardeners; adhesion promoters; dissolution rate modifiers; photocuring agents; photosensitizers; amplifiers; plasticizers; orientation control agents and cross linking agents.

7. A method of processing a substrate to form line space feature on a surface of a substrate, comprising:
   providing a substrate having a surface;
   providing a copolymer composition according to claim 1;
   applying a film of the copolymer composition to the surface of the substrate;
   optionally, baking the film;
   annealing the film by heating the film at 150 to 350° C. under a gaseous atmosphere for a period of 1 second to 4 hours; and,
   treating the annealed film to remove the poly(acrylate) block from the annealed film leaving a line space pattern on the surface of the substrate having a pitch, $L_0$, of 10 to 50 nm.

8. The method of claim 7, wherein the copolymer composition provided contains 10 to 25 wt % antioxidant (based on the weight of the copolymer component).

* * * * *